US009247341B2

(12) United States Patent
Lee et al.

(10) Patent No.: US 9,247,341 B2
(45) Date of Patent: Jan. 26, 2016

(54) SPEAKER MODULE

(71) Applicant: HTC Corporation, Taoyuan County (TW)

(72) Inventors: Yu-Sheng Lee, Taoyuan County (TW); Lei Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/303,548

(22) Filed: Jun. 12, 2014

(65) Prior Publication Data

US 2015/0245132 A1 Aug. 27, 2015

Related U.S. Application Data

(60) Provisional application No. 61/945,093, filed on Feb. 26, 2014.

(51) Int. Cl.

| | |
|---|---|
| ***H05K 5/02*** | (2006.01) |
| ***H04R 1/04*** | (2006.01) |
| ***H04R 1/28*** | (2006.01) |
| *H05K 5/00* | (2006.01) |
| *H04R 1/00* | (2006.01) |

(52) U.S. Cl.

CPC ............ *H04R 1/2807* (2013.01); *H04R 1/2823* (2013.01)

(58) Field of Classification Search

CPC ............ H04R 1/00; H04R 1/021; H04R 1/22; H04R 1/2807; H04R 1/2811; H04R 1/2823; H04R 1/2846; H04R 1/2849

USPC .......... 181/199, 148, 160, 151, 166; 381/345, 381/350, 165, 353

See application file for complete search history.

(56) References Cited

U.S. PATENT DOCUMENTS

| | | | | |
|---|---|---|---|---|
| 2,846,520 A | | 8/1958 | Brownscombe | |
| 3,688,864 A | | 9/1972 | Guss | |
| 3,805,915 A | * | 4/1974 | Payne | 181/148 |
| 3,819,879 A | * | 6/1974 | Baechtold | 375/242 |
| 4,030,564 A | * | 6/1977 | Itagaki | 181/166 |
| 4,064,375 A | * | 12/1977 | Russell et al. | 381/190 |
| 4,168,761 A | * | 9/1979 | Pappanikolaou | 181/156 |
| 4,284,166 A | * | 8/1981 | Gale | 181/156 |
| 4,413,703 A | * | 11/1983 | Kato et al. | 181/156 |

(Continued)

FOREIGN PATENT DOCUMENTS

| | | | | |
|---|---|---|---|---|
| DE | 3333754 A1 * | 4/1985 | | H04R 1/28 |
| EP | 2154906 | 2/2010 | | |

(Continued)

OTHER PUBLICATIONS

"Office Action of European Counterpart Application," issued on Jul. 2, 2015, p. 1-p. 3.

(Continued)

*Primary Examiner* — Edgardo San Martin

(74) *Attorney, Agent, or Firm* — Jianq Chyun IP Office

(57) ABSTRACT

A speaker module includes a speaker unit, a main body and a speaker carrier. The main body includes a sound outlet opening and an air pressure regulating structure. The sound outlet opening is configured to expose the speaker unit. The speaker carrier is configured to carry the speaker unit. The speaker carrier is disposed in the main body together with the speaker unit, and forms a resonance space with the main body. The air pressure regulating structure is configured to regulate the air pressure of the resonance space.

20 Claims, 7 Drawing Sheets

(56) References Cited

U.S. PATENT DOCUMENTS

| | | | | |
|---|---|---|---|---|
| 4,611,686 | A * | 9/1986 | Kobayashi et al. | 181/156 |
| 5,073,937 | A | 12/1991 | Almasy | |
| 5,150,418 | A * | 9/1992 | Honda et al. | 381/349 |
| 5,446,249 | A * | 8/1995 | Goodman et al. | 181/206 |
| 5,809,154 | A * | 9/1998 | Polk | 381/345 |
| 6,739,425 | B1 * | 5/2004 | Griffin et al. | 181/171 |
| 7,011,178 | B2 * | 3/2006 | Morkerken | 181/151 |
| 7,461,718 | B2 * | 12/2008 | Dedieu et al. | 181/148 |
| 7,838,768 | B2 * | 11/2010 | Zadach et al. | 174/50.5 |
| 8,280,095 | B2 * | 10/2012 | Lee et al. | 381/386 |
| 8,379,899 | B2 * | 2/2013 | Van Halteren | 381/352 |
| 8,494,577 | B2 * | 7/2013 | Shiogama et al. | 455/550.1 |
| 8,565,463 | B2 * | 10/2013 | Saiki et al. | 381/345 |
| 2002/0015501 | A1 * | 2/2002 | Sapiejewski | 381/71.6 |
| 2010/0183180 | A1 * | 7/2010 | Tsai | 381/338 |
| 2013/0136290 | A1 * | 5/2013 | Huang | 381/345 |
| 2013/0148834 | A1 | 6/2013 | Seo | |

FOREIGN PATENT DOCUMENTS

| | | | |
|---|---|---|---|
| JP | 2011135415 A | * | 7/2011 |
| JP | 2012121455 A | * | 6/2012 |

OTHER PUBLICATIONS

"Office Action of Europe Counterpart Application", issued on Oct. 7, 2015, p1-p5.

* cited by examiner

SPEAKER MODULE

CROSS-REFERENCE TO RELATED APPLICATION

This application claims the priority benefits of U.S. provisional application Ser. No. 61/945,093, filed on Feb. 26, 2014. The entirety of the above-mentioned patent application is hereby incorporated by reference herein and made a part of this specification.

TECHNICAL FIELD

The disclosure relates to a speaker module, and more particularly, to a speaker module having a good sound quality.

DESCRIPTION OF RELATED ART

In general, a speaker unit of a speaker module is driven by audio source signals, and generates resonance with the air molecules in the resonance space of the main body, so as to output sound wave signals out of the sound outlet opening of the main body. However, after fabrication of the speaker module is completed, if the resonance space is a hermetically sealed space, during transportation process, then the air pressure in the resonance space may not be regulated with the change of environment. For example, when the speaker module is transported by using an aircraft, the atmospheric pressure of the outside may be lower than the air pressure in the resonance space; when the speaker module is transported to the factory for assembling, the atmospheric pressure of the assembling environment may substantially be the same as the air pressure in the resonance space. Thus, the atmospheric pressure at where the speaker module is located may change with different environments. However, if the air pressure in the resonance space is unable to be regulated with the change of environment, the sound quality of when the speaker module outputs sound wave signals may easily be affected. Therefore, how to design a speaker module having sound quality and transportation cost benefit has become an important issue.

SUMMARY OF THE DISCLOSURE

The disclosure provides a speaker module with favorable sound quality.

A speaker module of the disclosure includes a speaker unit, a main body and a speaker carrier. The main body has a sound outlet opening. The sound outlet opening is configured to expose the speaker unit. The speaker carrier is configured to carry the speaker unit. The speaker carrier is disposed in the main body together with the speaker unit, and forms a resonance space with the main body. The main body includes an air pressure regulating structure. The air pressure regulating structure is configured to regulate the air pressure of the resonance space.

According to an exemplary embodiment of the disclosure, the main body includes a surrounding wall and a bottom wall. The speaker carrier, the surrounding wall and the bottom wall together define the resonance space. The bottom wall is disposed opposite to the sound outlet opening, and the air pressure regulating structure is disposed at the bottom wall.

According to an exemplary embodiment of the disclosure, the bottom wall includes a stepped structure. The air pressure regulating structure is disposed on the stepped structure of the bottom wall.

According to an exemplary embodiment of the disclosure, the speaker module further includes a covering thin body. The covering thin body is configured to partially cover the air pressure regulating structure, so as to expose a portion of the air pressure regulating structure. The air in the resonance space flows out of the main body through the portion of the air pressure regulation structure which is exposed.

According to an exemplary embodiment of the disclosure, the air pressure regulating structure includes a first air flowing channel. The first air flowing channel extends in a first direction, configured to connect the resonance space. The first air flowing channel includes a first channel hole. The air in the resonance space flows out of the main body through the first air flowing channel and the first channel hole.

According to an exemplary embodiment of the disclosure, the area of a cross section of the first air flowing channel in the first direction is smaller than a first threshold area value.

According to an exemplary embodiment of the disclosure, the cross section of the first air flowing channel is a circle, an ellipse or a polygon.

According to an exemplary embodiment of the disclosure, an extending length of the first air flowing channel in the first direction is larger than a first threshold length value.

According to an exemplary embodiment of the disclosure, the first direction is substantially parallel to a normal vector of a surface of the main body.

According to an exemplary embodiment of the disclosure, the air pressure regulating structure further includes an air flowing space. The air flowing space expands on the surface of the main body and is configured to connect the first air flowing channel and the resonance space. The air in the resonance space flows out of the main body through the air flowing space, the first air flowing channel and the first channel hole.

According to an exemplary embodiment of the disclosure, the area of a cross section of the air flowing space in the first direction is larger than a second threshold area value.

According to an exemplary embodiment of the disclosure, the cross section of the air flowing space is a circle, an ellipse or a polygon.

According to an exemplary embodiment of the disclosure, a depth of the air flowing space in the first direction is larger than a first threshold depth value.

According to an exemplary embodiment of the disclosure, the first direction is substantially parallel to a normal vector of the surface of the main body.

According to an exemplary embodiment of the disclosure, the air pressure regulating structure includes a second air flowing channel. The second air flowing channel extends in a second direction, configured to connecting the air flowing space and the resonance space. The second air flowing channel includes a second channel hole. The air in the resonance space flows out of the main body through the second channel hole, the second air flowing channel, the air flowing space, the first air flowing channel and the first channel hole.

According to an exemplary embodiment of the disclosure, the area of a cross section of the second air flowing channel in the second direction is larger than a third threshold area value.

According to an exemplary embodiment of the disclosure, the cross section of the first air flowing channel is a circle, an ellipse or a polygon. The cross section of the first air flowing channel is a portion of the circle, a portion of the ellipse or a portion of the polygon.

According to an exemplary embodiment of the disclosure, an extending length of the second air flowing channel in the second direction is larger than a second threshold length value.

According to an exemplary embodiment of the disclosure, a depth of the second air flowing channel in the first direction is smaller than a second threshold depth value.

According to an exemplary embodiment of the disclosure, the surrounding wall includes a pair of parallel long walls, and the second direction is substantially parallel to an extending direction of the pair of parallel long walls.

In light of the above, in the embodiment of the disclosure, the air pressure regulating structure of the main body may be configured to regulate the air pressure in the resonance space. Through appropriate design of the air pressure regulating structure, noise signal of the speaker module may be reduced, and a good sound quality is maintained. To make the above features and advantages of the disclosure more comprehensible, several embodiments accompanied with drawings are described in detail as follows.

DETAILED DESCRIPTION OF DISCLOSED EXEMPLARY EMBODIMENTS

Figure 1:
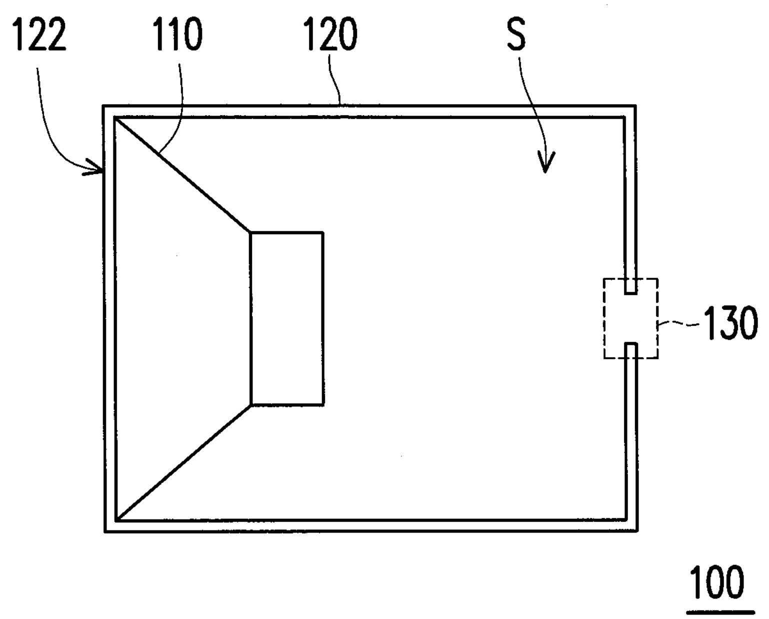
FIG. 1 is a schematic view illustrating a speaker module according to an embodiment of the disclosure.

FIG. 1 is a schematic view illustrating a speaker module according to an embodiment of the disclosure. Please refer to FIG. 1, the speaker module 100 of the embodiment includes a speaker unit 110 and a main body 120. In the embodiment, the main body 120 includes an air pressure regulating structure 130. The internal walls of the main body 120 form a resonance space S. The speaker unit 110 is driven by audio source signals, and generates resonance with the air molecules in the resonance space S, so as to output sound wave signals out of a sound outlet opening 122 of the main body 120. In general, if the resonance space S is a hermetically sealed space, during transportation process of the speaker module 100, the air pressure in the resonance space S may not be regulated with the change of the environment. In the embodiment, at least due to the existence of air pressure regulating structure 130, the resonance space S may communicate with external environment, thus the air molecules within the resonance space S may flow out of the main body 120, and the air molecules from the outside may also flow into the resonance space S. Therefore, the air pressure regulating structure 130 may be configured to regulate the air pressure of the resonance space S.

Figure 2:
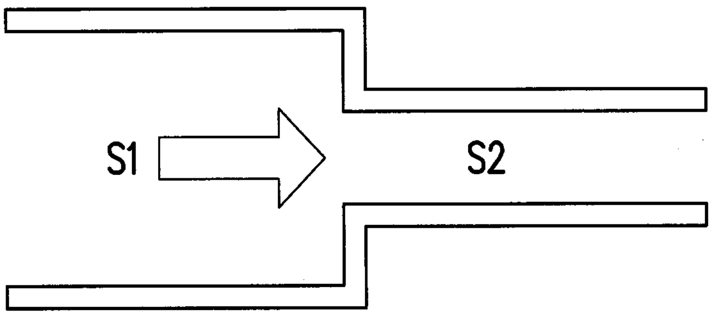
FIG. 2 is a schematic view illustrating air molecules flow in two different communicating spaces.
Figure 3:
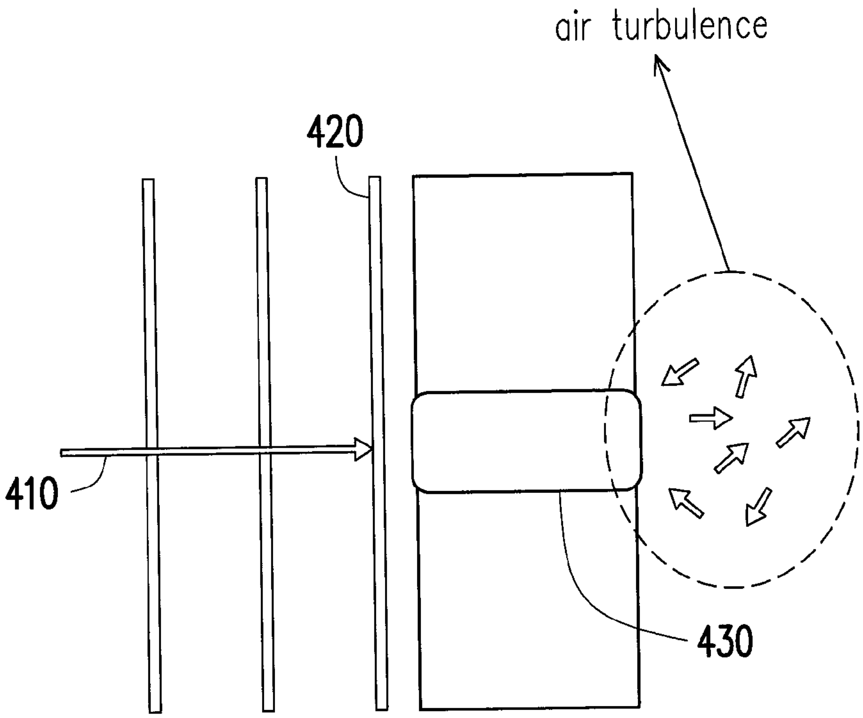
FIG. 3 is a schematic view illustrating air molecules are transmitted from the left space to the right space through the air flowing channel.

According to illustration of Bernoulli's Theorem, when air molecules flow in two different communicating spaces, the moving speed of the air molecules may be affected since the cross section areas of the communicating spaces are not the same. FIG. 2 is a schematic view illustrating air molecules flow in two different communicating spaces. Please refer to FIG. 2, in the example, the cross section area of the first communicating space S1 is larger than the cross section area of the second communicating space S2, thus when the air molecules flow from the first communicating space S1 to the second communicating space S2, the moving speed of the air molecules may become faster. On the contrary, when the air molecules flow from the second communicating space S2 to the first communicating space S1, the moving space of the air molecules may become slower. However, regardless the moving speed of the air molecules become faster or slower, as long as the moving speed of the air molecules change, air turbulence may be easily formed in the communicating space. FIG. 3 is a schematic view illustrating air molecules are transmitted from the left space to the right space through the air flowing channel. Please refer to FIG. 3, the air molecules move toward the right space through the air flowing channel 430 along the speed direction 410, and the label 420 represents the wavefront of the sound wave corresponding to the air molecules. According to illustration of Bernoulli's Theorem, when the air molecules are transmitted to the right space through the air flowing channel 430, air turbulence may be generated.

Figure 4:
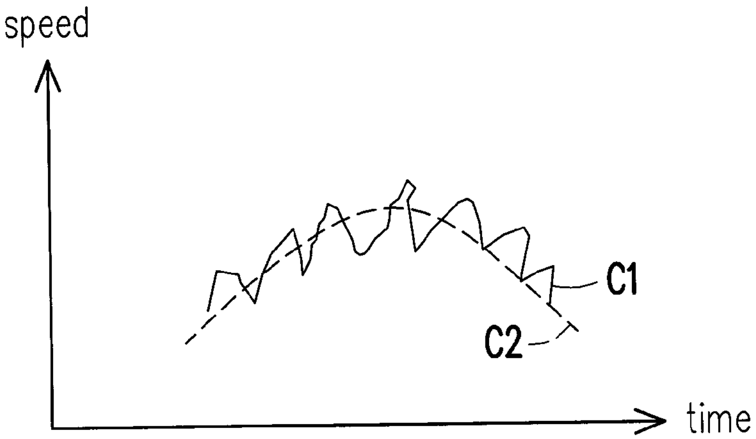
FIG. 4 is a relationship diagram showing moving speed of the air molecules change with time.

The air turbulence may easily cause noise signals when the speaker unit 110 of the speaker module 100 makes a sound, and the sound quality may be affected. At least in order to reduce the noise signal, to maintain a good sound quality, through appropriate design of the air pressure regulating structure 130 in the embodiment of the disclosure, the acoustic impedance of air the air molecules encounter may be regulated, so as to reduce the effect of the air turbulence to the sound quality. FIG. 4 is a relationship diagram showing moving speed of the air molecules change with time. Please refer to FIG. 4, in FIG. 4, the speed curve C1 represents the relationship illustrating the moving speed changes with time when the air molecules generate air turbulence. In the example, since the air molecules generate a phenomenon of air turbulence, the speed curve C1 may appear to be abnormally tortuous and quivering, noise signals may be generated when the speaker unit 110 makes a sound, and the sound quality is reduced. Through the appropriate design of the air pressure regulating structure the acoustic impedance of air is regulated, and the effect of the air turbulence to the air molecules may be reduced. The speed curve C2 represents the relationship illustrating the moving speed changes with time after the acoustic impedance of air is regulated. In the example, since the moving speed of air molecules is not easy to be affected by the air turbulence, the speed curve C2 may appear to be comparatively smoother, representing noise signals may be comparatively lower when the speaker unit 110 of the embodiment makes a sound, and the sound quality is good. The design of the air pressure regulating structure of the disclosure is illustrated with reference of at least one exemplary embodiment as follows. However, the disclosure is not limited to the described embodiment, and the embodiment may have suitable change.

Figure 5:
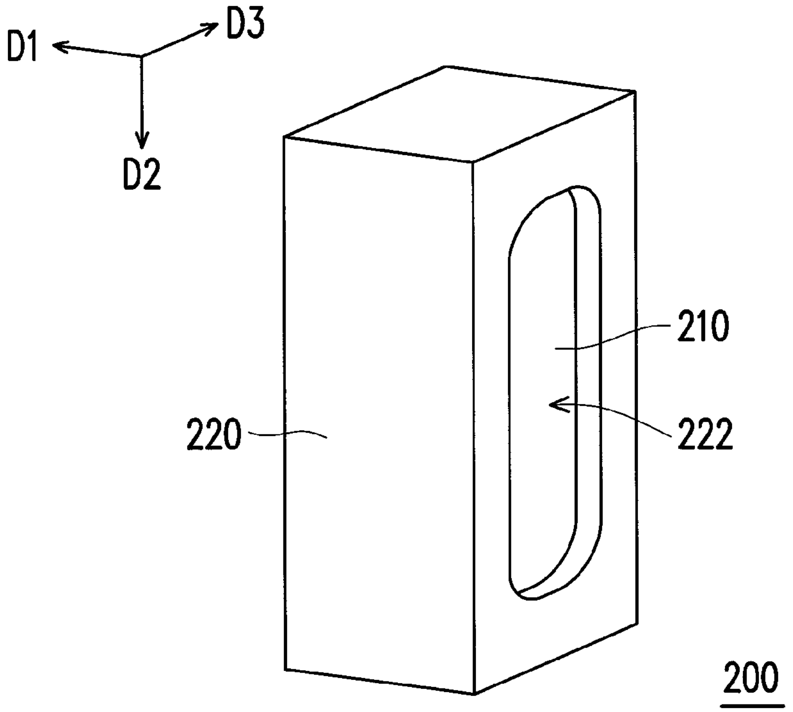
FIG. 5 and FIG. 6 are schematic views illustrating a speaker module in different viewing angles according to another embodiment of the disclosure.
Figure 6:
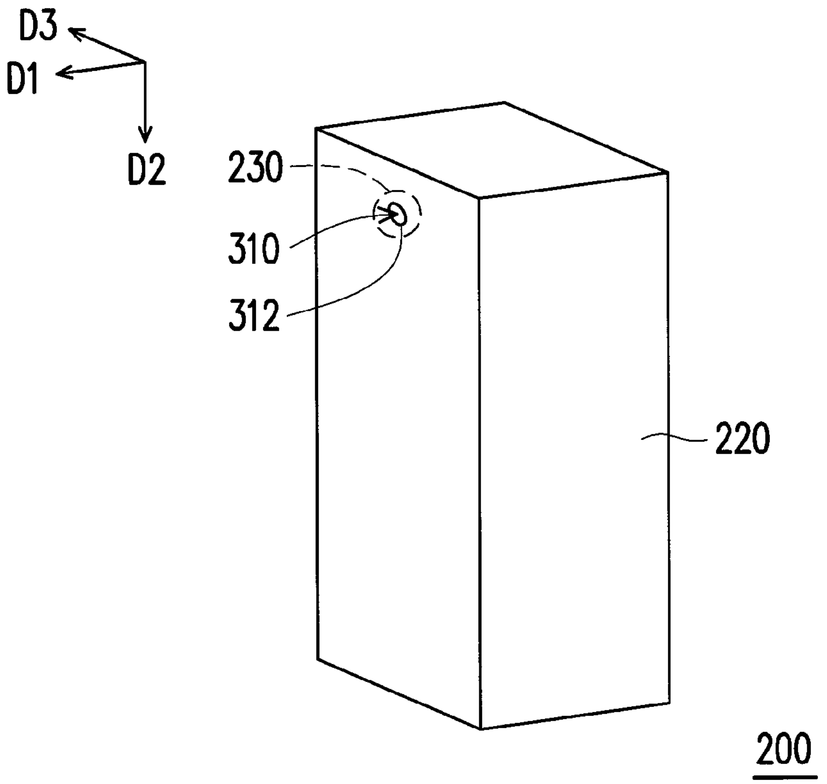
Figure 7:
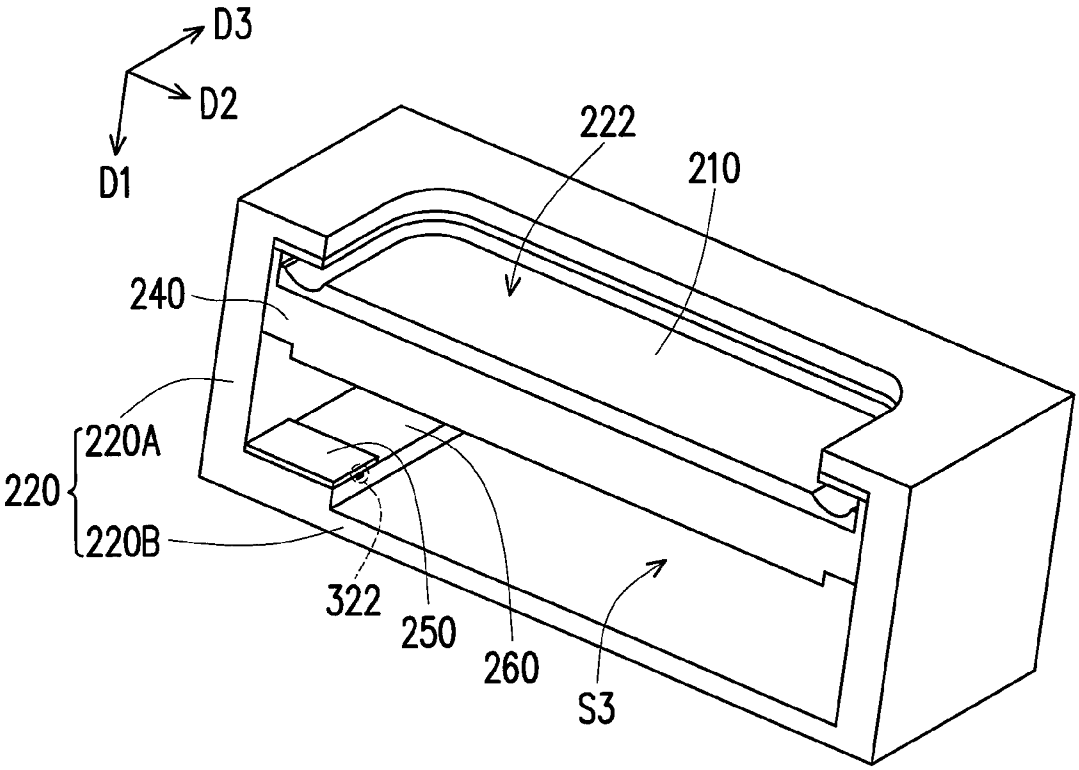
FIG. 7, FIG. 8, FIG. 9 and FIG. 10 are schematic views illustrating the internal structure of the speaker module of FIG. 5 and FIG. 6 corresponding to different cross section lines.

FIG. 5 and FIG. 6 are schematic views illustrating a speaker module in different viewing angles according to another embodiment of the disclosure. FIG. 7, FIG. 8, FIG. 9 and FIG. 10 are schematic views illustrating the internal structure of the speaker module of FIG. 5 and FIG. 6 corresponding to different cross section lines. Please refer to FIG. 5 to FIG. 10 at the same time, the speaker module 200 of the embodiment includes a speaker unit 210, a main body 220, a speaker carrier 240 and a covering thin body 250. The main body 220 includes a sound outlet opening 222 and an air pressure regulating structure 230. The sound outlet opening 222 is configured to expose the speaker unit 210. In the embodiment, the dimension, outer appearance and profile of the sound outlet opening 222 are only exemplarily illustrated, the disclosure is not limited thereto. The speaker carrier 240 is configured to carry the speaker unit 210. The speaker carrier 240 and the speaker unit 210 are disposed together in the main body 220. The speaker carrier 240 and the main body 220 form a resonance space S3. In the embodiment, the speaker unit 210 is driven by audio source signals, and generates resonance with the air molecules in the resonance space S3, so as to output sound wave signals out of the sound outlet opening 222 of the main body 220.

Specifically, the outer appearance of the main body 220 of the embodiment is exemplarily illustrated as a cuboid, but the disclosure is not limited thereto. In other embodiments, the outer appearance of the main body 220 may have any other suitable stereoscopic geometrical profile. In the embodiment, the main body 220 includes a surrounding wall 220A and a bottom wall 220B. The bottom wall 220B of the embodiment is disposed opposite to the main body 222 in the first direction D1. The bottom wall 220B includes a stepped structure 260. In the embodiment, the stepped structure 260 is selectively disposed, in other embodiments, the bottom wall 220B may not include the stepped structure 260, at this time, the surface of the bottom wall 220B in the main body 220 is smooth and without a step. The surrounding wall 220A of the embodiment includes a pair of parallel long walls 224 and a pair of parallel short walls 226. The parallel long walls 224 extend in the second direction D2, and arranged in the third direction D3. The parallel short walls 226 extend in the third direction D3, and arranged in the second direction D2. In the embodiment, three of the speaker carrier 240, the surrounding wall 220A and the bottom wall 220B together define the resonance space S3.

In the embodiment, the air pressure regulating structure 230 is disposed on the stepped structure 260 of the bottom wall 220B. The covering thin body 250 is configured to partially cover the air pressure regulating structure 230, in order to expose a portion of the air pressure regulating structure 230, so that the air in the resonance space S3 flow out of the main body 220 through a portion of the air pressure regulating structure 230 which is exposed, so as to achieve the purpose of regulating the air pressure in the resonance space S3. In the embodiment, a portion of the exposed air pressure regulating structure 230 may be a second channel hole 322 of the air pressure regulating structure 230, for example. Therefore, the air in the resonance space S3 may at least flow out of the main body 220 through the second channel hole 322, on the contrary, the air outside the resonance space S3 may flow into the main body 220 through the first channel hole 312, so as to balance the air pressure inside and outside the resonance space S3.

It should be noted that, in the embodiment, it is merely for exemplarily illustrating that the air pressure regulating structure 230 is disposed on the stepped structure 260 of the bottom wall 220B, the disclosure is not limited thereto. In the embodiment in which the bottom wall 220B does not include the stepped structure 260, the air pressure regulating structure 230 may also be directly disposed on any position of the bottom wall 220B. In addition, the air pressure regulating structure 230 is not limited to be disposed on the bottom wall 220B, in other embodiments, the air pressure regulating structure 230 may also be disposed on the surrounding wall 220A of the main body 220, namely, the disposing position of the air pressure regulating structure 230 is not limited in the disclosure. In addition, in the embodiment, the covering thin body 250 is a flexible material, for example, but not limited to be a thin film of metal or plastic material, such as polyester film.

Figure 8:
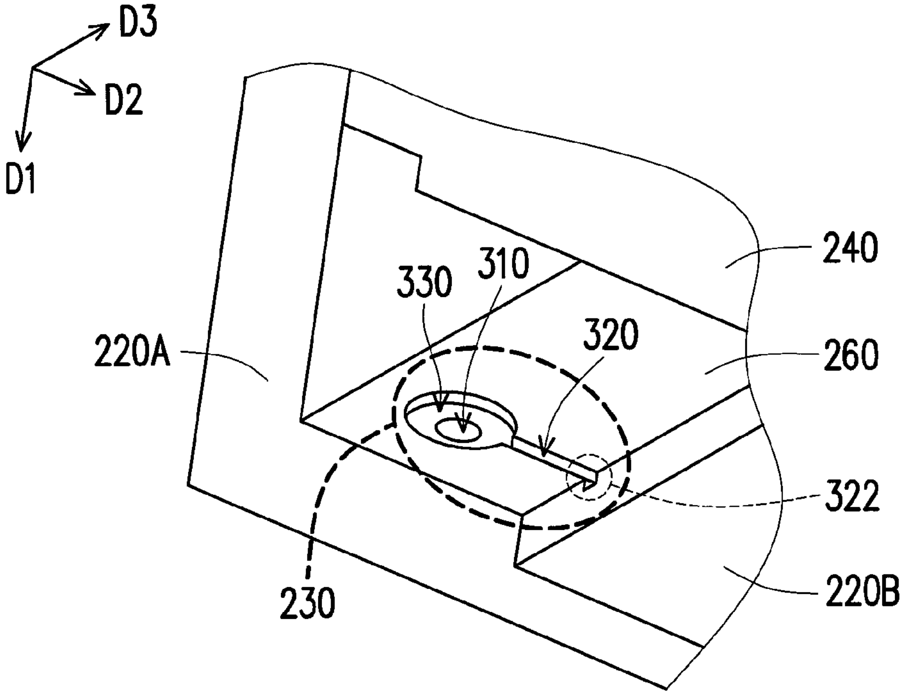
Figure 9:
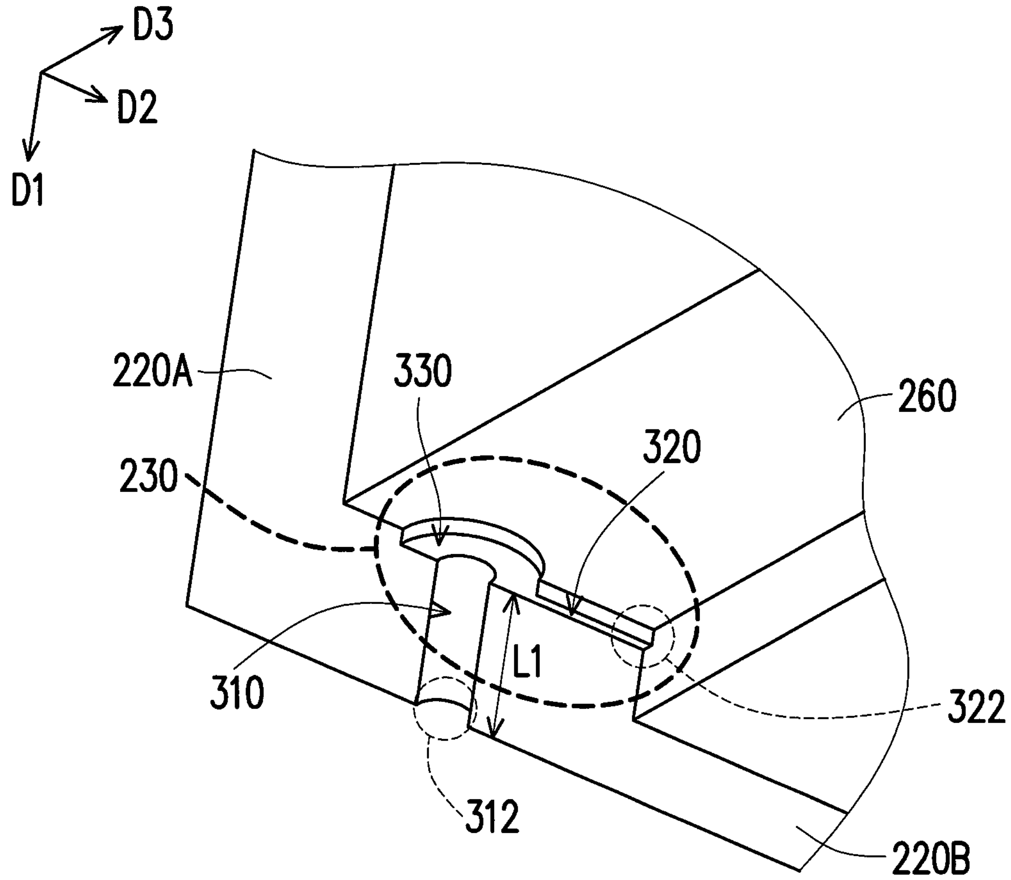
Figure 10:
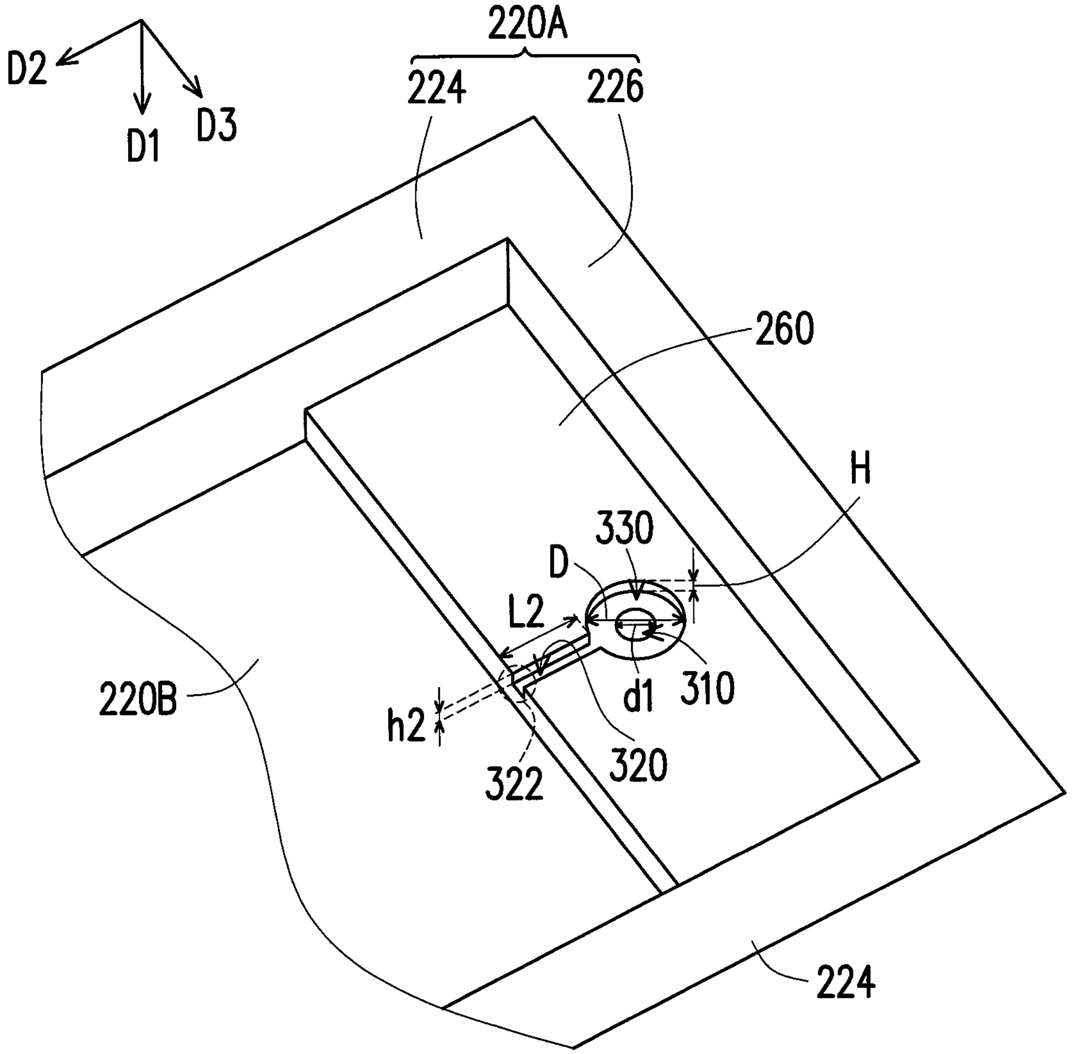

For the sake of clearly showing the air pressure regulating structure 230, the covering thin body 250 is not shown in FIG. 8 to FIG. 10. In the embodiment, the air pressure regulating structure 230 includes a first air flowing channel 310, an air flowing space 330 and a second air flowing channel 320. In the embodiment, the air in the resonance space S3 may flow out of the main body 220 through the second channel hole 322, the second air flowing channel 320, the air flowing space 330, the first air flowing channel 310 and the first channel hole 312. On the contrary, the air outside the resonance space S3 may flow into the main body 220 through the first channel hole 312, the first air flowing channel 310, the air flowing space 330, the second air flowing channel 320, and the second channel hole 322, so as to balance the air pressure inside and outside the resonance space S3.

In the embodiment, the first air flowing channel 310 extends in the first direction D1, and connected with the outside of the main body through the first channel hole 312. The second air flowing channel 320 extends in the second direction D2, and connected with the resonance space S3 of the inside of the main body 220 through the second channel hole 322. In the embodiment, the first direction D1 is substantially perpendicular to the second direction D2, namely, the first air flowing channel 310 is substantially perpendicular to the second air flowing channel 320, however the disclosure is not limited thereto. In another embodiment, the first air flowing channel 310 and the second air flowing channel 322 may not be perpendicular to each other.

In the embodiment, the first air flowing channel 310 substantially perpendicularly penetrates from the surface of the bottom wall 220B of the main body 220 which is facing the surface of the resonance space S3 to the outside of the main body 220 along the first direction D1, but the disclosure is not limited thereto. In another embodiment, the first air flowing channel 310 may also penetrate from the surface of the bottom 220B to the outside of the main body 220 along an inclined direction. An acute included angle which is less than 90 degrees is between the inclined direction and the first direction, for example. In addition, in the embodiment, the cross section of the first air flowing channel 310 in the first direction D1 is a circle, but the disclosure is not limited thereto. In other embodiments, the cross section of the first air flowing channel 310 in the first direction D1 may also be an ellipse or a polygon. The polygon includes, but not limited to, polygon such as a triangle, a square, a rectangle, a rhombus, a trapezium, a pentagon, a hexagon, and so on.

In the embodiment, the second air flowing channel 320 extends in the second direction D2, namely, the extending direction of the second air flowing channel 320 is substantially parallel to the extending direction of the parallel long walls 224, however the disclosure is not limited thereto. In another embodiment, the extending direction of the second air flowing channel 320 and extending direction of the parallel long walls 224 may not be parallel to each other. In other words, in the another embodiment an included angle is between the extending direction of the second air flowing channel 320 and the second direction D2, for example. The included angle may be an acute angle, a right angle or an obtuse angle. In addition, in the embodiment, the cross section of the second air flowing channel 320 in the second direction D2 is a rectangle, for example, but the disclosure is not limited thereto. In other embodiments, the cross section of the second air flowing channel 320 in the second direction D2 may also be a circle, an ellipse or other polygon. The polygon includes, but not limited to, polygon such as a triangle, a square, a rhombus, a trapezium, a pentagon, a hexagon, and so on. Alternatively, the cross section of the second air flowing channel 320 in the second direction D2 of the disclosure may also be a portion of the circle, a portion of the ellipse or a portion of the polygon, but the disclosure is not limited thereto.

In the embodiment, the air flowing space 330 expands on the surface of the bottom wall 220B of the main body 220 which is facing the surface of the resonance space S3, configured to connect the first air flowing channel 330, the second air flowing channel 320 and the resonance space S3. In the embodiment, the cross section of the air flowing space in the first direction D1 is a circle, for example, but the disclosure is not limited thereto. In other embodiments, the cross section of the air flowing space 330 in the first direction D1 may also be an ellipse or a polygon. The polygon includes, but not limited to, polygon such as a triangle, a square, a rectangle, a rhombus, a trapezium, a pentagon, a hexagon, and so on.

In the exemplary embodiments of the disclosure, through appropriate design of the air pressure regulating structure, the acoustic impedance of air the air molecules encounter may be regulated, and the effect of the air turbulence to the sound quality may be reduced. Thus, by using design of each structural parameter of the first air flowing channel 310, the air flowing space 330 and the second air flowing channel 320 of the air pressure regulating structure 230, the effect of noise signals of a specific band on the sound quality may be reduced.

As an example, please refer to FIG. 9 and FIG. 10, the area of the cross section of the first air flowing channel 310 in the first direction D1 is smaller than a first threshold area value in the embodiment, for example. Taking a circular cross section as an example, responding to the one dimensional structural parameter, it means that the diameter d1 of the first channel hole 312 of the first air flowing channel 310 is smaller than a first diameter threshold value, for example d1<0.2 mm (millimeter). In addition, in the embodiment, the extending length L1 of the first air flowing channel 310 in the first direction D1 is larger than a first threshold length value.

In the embodiment, the area of the cross section of the air flowing space 330 in the first direction D1 is larger than a second threshold area value. Taking a circular cross section as an example, responding to the one dimensional structural parameter, it means that the diameter D of the air flowing space 330 is larger than a second diameter threshold value, for example D>0.4 mm (millimeter). In addition, the depth H of the air flowing space 330 in the first direction D1 is larger than a first threshold depth value in the embodiment, for example.

In the embodiment, the area of the cross section of the second air flowing channel 320 in the second direction D2 is larger than a third threshold area value, for example. Taking a rectangular cross section as an example, responding to one of the one dimensional structural parameters, it means that the depth h2 of the second air flowing channel 320 in the first direction D1 is smaller than a second threshold depth value, for example h2<0.15 mm. In addition, in the embodiment, the extending length L2 of the second air flowing channel 320 in the second direction D2 is larger than a second threshold length value, for example L2>1.4 mm.

Figure 11:
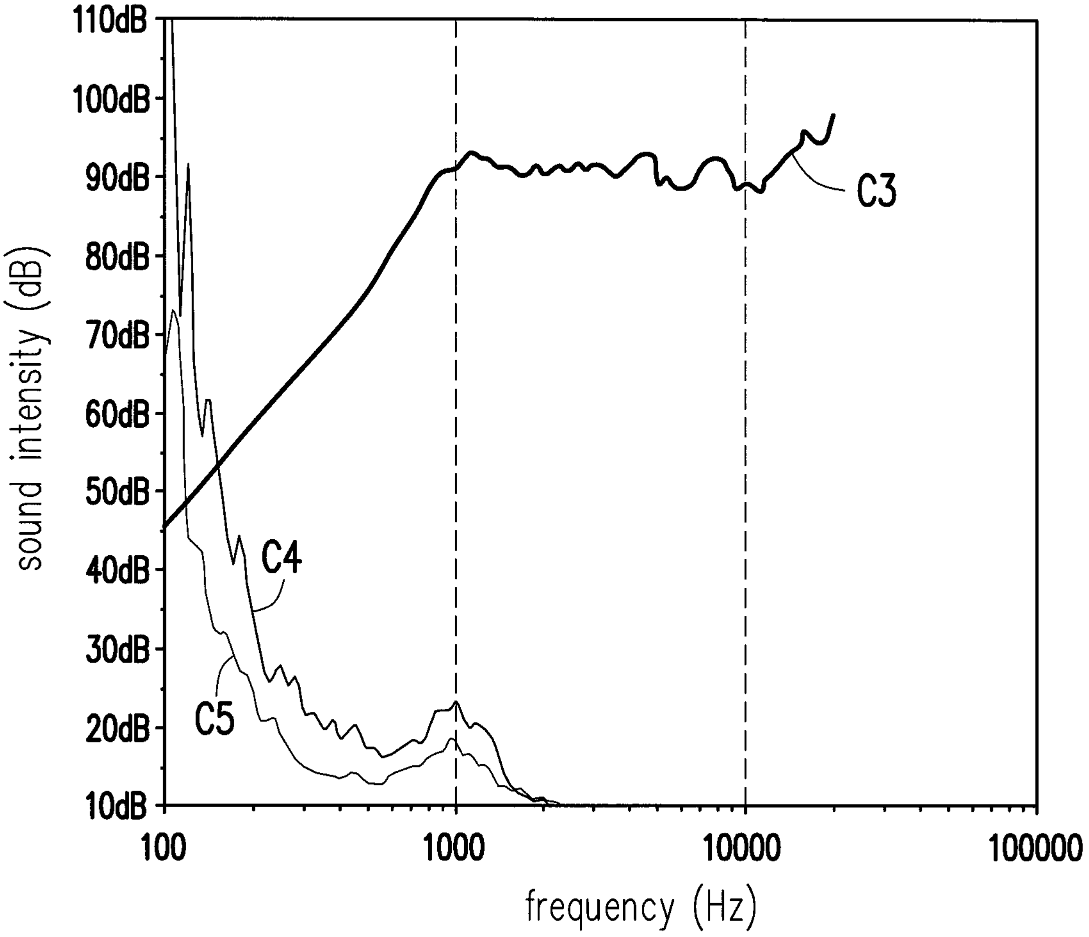
FIG. 11 is a curve relationship illustrating the effect of noise signal of a specific band on the sound quality according to an embodiment of the disclosure.

FIG. 11 is a curve relationship illustrating the effect of noise signal of a specific band on the sound quality according to an embodiment of the disclosure. Please refer to FIG. 11, at least based on the design of air pressure regulating structure 230 of FIG. 5 to FIG. 10, when the speaker module 220 of the embodiment makes a sound, at least in the frequency range of 1000 Hz (Hertz) to 10000 Hz, the sound quality curve C3 appears to be comparatively smoother, compared to the sound quality curves C4, C5 of other embodiments, the noise signals of the speaker module 220 is lower when making a sound, the sound quality is good.

In the embodiment of the disclosure, the covering thin body 250, the stepped structure 260 of the bottom wall 220B, and the first air flowing channel 310, the air flowing space 330 and the second air flowing channel 320 of the air pressure regulating structure 230 of the speaker module 200, may all be designed as actual requirements or selectively disposed according to the frequency band of which the noise signals are desired to be reduced, the disclosure is not limited thereto. For example, the air pressure regulating structure 230 may only include one of the three, or two of the three, or all of the three, as the same as the air pressure regulating structure 230 of the embodiment shown in FIG. 5 to FIG. 10, of the first air flowing channel 310, the air flowing space 330 and the second air flowing channel 320.

In light of the foregoing, in the embodiments of the disclosure, the air pressure regulating structure of the main body may be configured to regulate the air pressure in the resonance space. Through appropriate design of the air pressure regulating structure, at least the effect of the air turbulence on the sound quality of the speaker module may be reduced, and noise signals may be reduced, and a good sound quality is maintained. Moreover, by using the design of each structural parameter of the air pressure regulating structure, the effect of the noise signals of the specific band to the sound quality may also be reduced.

Although the invention has been disclosed by the above embodiments, they are not intended to limit the disclosure. Anybody skilled in the art may make modifications and variations without departing from the spirit and scope of the disclosure. Therefore, the protection range of the disclosure falls within the appended claims.

What is claimed is:

1. A speaker module, comprising:

a speaker unit;

a main body, having a sound outlet opening configured to expose the speaker unit;

a speaker carrier, configured to carry the speaker unit, and disposed in the main body together with the speaker unit, and forming a resonance space with the main body, wherein the main body comprises an air pressure regulating structure configured to regulate an air pressure of the resonance space; and a covering thin body, located in the resonance space and configured to partially cover the air pressure regulating structure, so as to expose a portion of the air pressure regulating structure, wherein an air in the resonance space flows out of the main body through the exposed portion of the air pressure regulating structure.

2. The speaker module as claimed in claim 1, wherein the main body comprises a surrounding wall and a bottom wall, the speaker unit, the surrounding wall and the bottom wall together define the resonance space, wherein the bottom wall is disposed opposite to the sound outlet opening, and the air pressure regulating structure is disposed at the bottom wall.

3. The speaker module as claimed in claim 2, wherein the bottom wall comprises a stepped structure, the air pressure regulating structure is disposed on the stepped structure of the bottom wall.

4. The speaker module as claimed in claim 1, wherein the air pressure regulating structure comprises:

a first air flowing channel, extending in a first direction and configured to connect the resonance space, and the first air flowing channel comprising a first channel hole, wherein an air in the resonance space flows out of the main body through the first air flowing channel and the first channel hole.

5. The speaker module as claimed in claim 4, wherein an area of a cross section of the first air flowing channel in the first direction is smaller than a first threshold area value.

6. The speaker module as claimed in claim 5, wherein the cross section of the first air flowing channel is a circle, an ellipse, or a polygon.

7. The speaker module as claimed in claim 4, wherein an extending length of the first air flowing channel in the first direction is larger than a first threshold length value.

8. The speaker module as claimed in claim 4, wherein the first direction is substantially parallel to a normal vector of a surface of the main body.

9. The speaker module as claimed in claim 4, wherein the air pressure regulating structure further comprises:

an air flowing space, expanding on a surface and configured to connect the first air flowing channel and the resonance space, wherein the air in the resonance space flows out of the main body through the air flowing space, the first air flowing channel and the first channel hole.

10. The speaker module as claimed in claim 9, wherein an area of a cross section of the air flowing space in the first direction is larger than a second threshold area value.

11. The speaker module as claimed in claim 10, wherein the cross section of the air flowing space is a circle, an ellipse, or a polygon.

12. The speaker module as claimed in claim 9, wherein a depth of the air flowing space in the first direction is larger than a first threshold depth value.

13. The speaker module as claimed in claim 9, wherein the first direction is substantially parallel to a normal vector of the surface of the main body.

14. The speaker module as claimed in claim 9, wherein the air pressure regulating structure further comprises:

a second air flowing channel, extending in a second direction and configured to connect the air flowing space and the resonance space, and the second air flowing channel comprising a second channel hole, wherein the air in the resonance space flows out of the main body through the second channel hole, the second air flowing channel, the air flowing space, the first air flowing channel and the first channel hole.

15. The speaker module as claimed in claim 14, wherein an area of a cross section of the second air flowing channel in the second direction is larger than a third threshold area value.

16. The speaker module as claimed in claim 15, wherein the cross section of the first air flowing channel is a circle, an ellipse, or a polygon, or a portion of the circle, a portion or the ellipse or a portion of the polygon.

17. The speaker module as claimed in claim 14, wherein an extending length of the second air flowing channel in the second direction is larger than a second threshold length value.

18. The speaker module as claimed in claim 14, wherein a depth of the second flowing channel in the first direction is smaller than a second threshold depth value.

19. The speaker module as claimed in claim 14, wherein the first direction is substantially perpendicular to the second direction.

20. The speaker module as claimed in claim 14, wherein the main body comprises a surrounding wall and a bottom wall, the speaker unit, the surrounding wall and the bottom wall together define the resonance space, wherein the surrounding wall comprises a pair of parallel long walls, and the second direction is substantially parallel to an extending direction of the pair of parallel long walls.

* * * * *